（12）United States Patent
Ding et al.

(10) Patent No.: US 11,281,839 B2
(45) Date of Patent: Mar. 22, 2022

(54) METHOD, APPARATUS AND ELECTRONIC DEVICE FOR PHOTOLITHOGRAPHIC MASK OPTIMIZATION OF JOINT OPTIMIZATION OF PATTERN AND IMAGE

(71) Applicant: SHENZHEN JINGYUAN INFORMATION TECHNOLOGY CO., LTD, Shenzhen (CN)

(72) Inventors: Ming Ding, Shenzhen (CN); Weijie Shi, Shenzhen (CN)

(73) Assignee: SHENZHEN JINGYUAN INFORMATION TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 17/389,496

(22) Filed: Jul. 30, 2021

(65) Prior Publication Data

US 2022/0027548 A1    Jan. 27, 2022

Related U.S. Application Data

(63) Continuation of application No. PCT/CN2019/073989, filed on Jan. 30, 2019.

(51) Int. Cl.
*G06F 30/30* (2020.01)
*G06F 30/398* (2020.01)
*G03F 1/70* (2012.01)

(52) U.S. Cl.
CPC .............. *G06F 30/398* (2020.01); *G03F 1/70* (2013.01)

(58) Field of Classification Search
CPC ..... G06F 30/367; G06F 2119/18; G06F 30/39; G06F 2111/04; G06F 2111/08;
(Continued)

(56) References Cited

U.S. PATENT DOCUMENTS

| | | | | |
|---|---|---|---|---|
| 6,611,953 | B1 * | 8/2003 | Filseth | G03F 1/36 716/54 |
| 2007/0186206 | A1 * | 8/2007 | Abrams | G03F 1/36 716/52 |

(Continued)

FOREIGN PATENT DOCUMENTS

| | | |
|---|---|---|
| CN | 102759861 A | 10/2012 |
| CN | 102981355 A | 3/2013 |
| CN | 108490735 A | 9/2018 |

*Primary Examiner* — Binh C Tat
(74) *Attorney, Agent, or Firm* — Andrew C. Cheng

(57) ABSTRACT

The present invention relates generally to the technical field of integrated circuit mask design, and more particularly to a method, an apparatus and an electronic device for photolithographic mask optimization of joint optimization of pattern and image. The method includes steps: inputting the main pattern; dividing edges of each main pattern into short edges, and regarding the short edges as a first variable for optimizing the main pattern; generating same or similar assistant feature sample points around same or similar main patterns, and regarding the assistant feature sample points as a second variable for optimizing the main pattern; and forming an objective function with the first variable and the second variable as optimization variables. The rules for generating assistant feature sample points around each main pattern are consistent, which are not limited to specific locations of the main pattern and ensures the consistency of final results for optimizing each main pattern.

6 Claims, 9 Drawing Sheets

(58) Field of Classification Search
CPC .... G06F 2119/12; G06F 30/33; G06F 30/398; G06F 30/00; G03F 1/36; G03F 7/705; G03F 7/70091; G03F 7/70283; G03F 7/70291; G03F 1/68; G03F 1/84; G03F 7/70508; G03F 7/70125; G03F 1/70; G03F 1/78; G03F 7/70275; G03F 7/70433; G03F 7/70466; G03F 1/50; G03F 1/54; G03F 1/60; G03F 9/00; G03F 1/32; G03F 1/34; G03F 1/44; G03F 1/76; G03F 7/2059; G03F 7/70208; G03F 7/70258; G03F 7/704; G03F 7/70408; G03F 7/70441; G03F 7/70475; G03F 7/70516; G03F 7/70591; G03F 7/70791; G03F 7/70941; G03F 7/2022; G03F 7/701; G03F 7/70308; G03F 7/70333; G03F 7/70425; G03F 7/70483; G03F 7/70533; G03F 7/70558; G03F 7/70625; G03F 7/70641; G06T 2207/30148; G06T 7/001; G01N 2021/95676; G01N 21/8851; G01N 21/47
USPC ...................................................... 716/50–56
See application file for complete search history.

(56) References Cited

U.S. PATENT DOCUMENTS

| | | | |
|---|---|---|---|
| 2012/0052418 A1* | 3/2012 | Tian | G03F 1/70 430/5 |
| 2013/0198700 A1 | 8/2013 | Sakajiri | |
| 2013/0239071 A1 | 9/2013 | Chang et al. | |
| 2018/0314163 A1* | 11/2018 | Liu | G03F 7/70441 |

\* cited by examiner

S3

```
┌─────────────────────────────────────────────────────┐
│ Setting a minimum variable x1 and a maximum variable x2 │──S31
│ formed by an assistant feature placement area.      │
└─────────────────────────────────────────────────────┘
                        │
                        ▼
┌─────────────────────────────────────────────────────┐
│ Enlarging the main pattern by x1 to obtain a pattern A, and │──S32
│ enlarging the main pattern by x2 to obtain a pattern B. │
└─────────────────────────────────────────────────────┘
                        │
                        ▼
┌─────────────────────────────────────────────────────┐
│ Obtaining the assistant feature placement area by performing │──S33
│ an exclusive OR operation on the pattern A and the pattern B. │
└─────────────────────────────────────────────────────┘
                        │
                        ▼
┌─────────────────────────────────────────────────────┐
│ Generating the assistant feature sample points in the assistant │──S34
│ feature placement area.                             │
└─────────────────────────────────────────────────────┘
```

FIG. 4

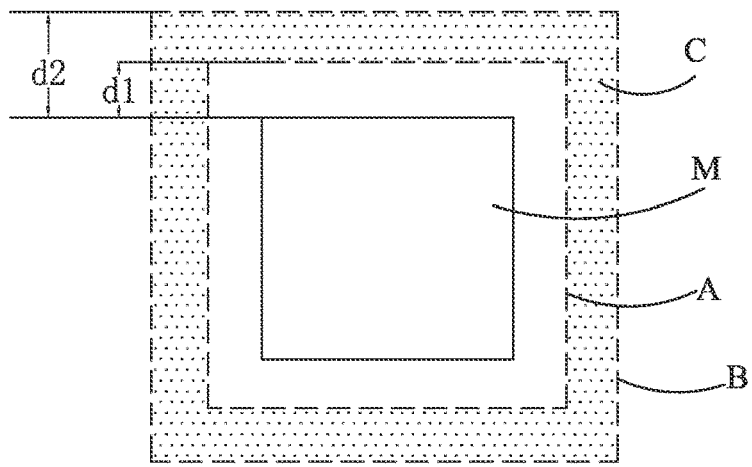

| Gridding the mask to be optimized to obtain a gridded mask image MI; the mask to be optimized includes an initial mask to be optimized and masks after each iteration. | S41 |

↓

| Converting the gridded mask image MI into an exposure dose distribution map AI. | S42 |

↓

| Calculating and obtaining the RI through the exposure dose distribution map AI. | S43 |

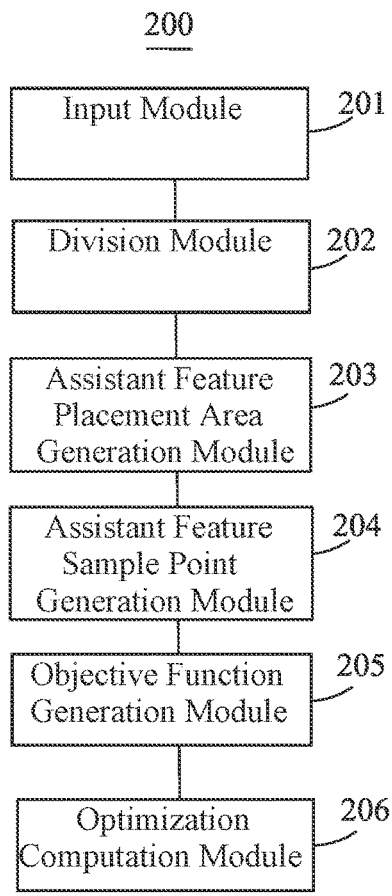
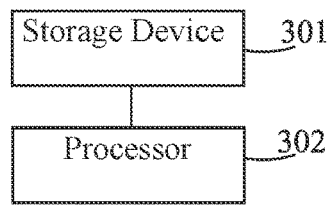
FIG. 13
FIG. 14
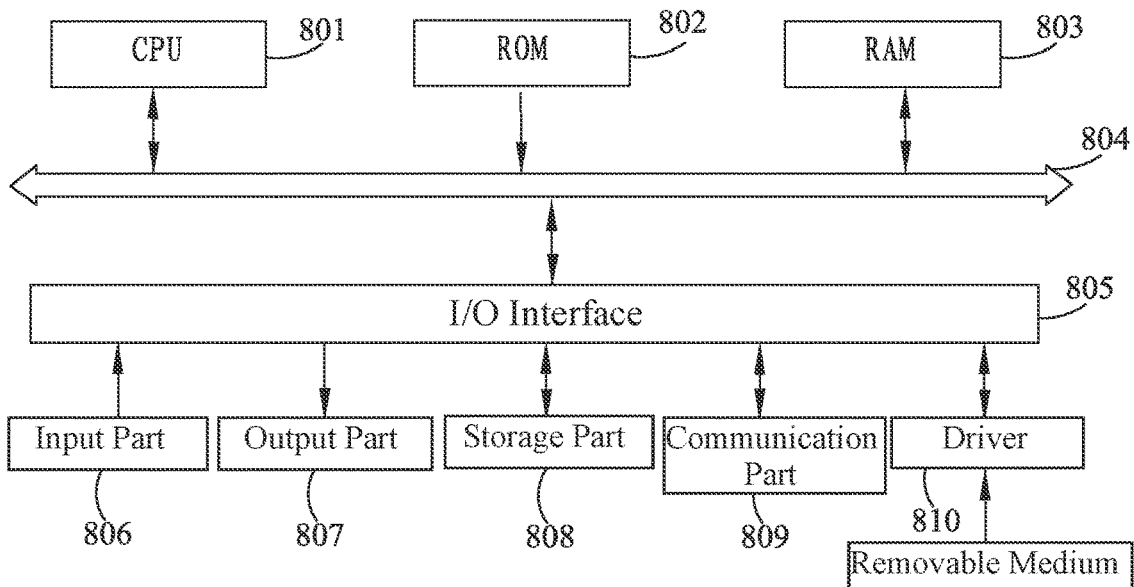
FIG. 15

METHOD, APPARATUS AND ELECTRONIC DEVICE FOR PHOTOLITHOGRAPHIC MASK OPTIMIZATION OF JOINT OPTIMIZATION OF PATTERN AND IMAGE

TECHNICAL FIELD

The present invention relates generally to the technical field of integrated circuit mask design, and more particularly to a method, an apparatus and an electronic device for photolithographic mask optimization of joint optimization of pattern and image.

BACKGROUND

Photolithography is one of the most important parts of the integrated circuit manufacturing process, which determines the advanced level of the integrated circuit manufacturing process. The litho cell is usually described as an optical imaging system, including four basic elements—an illumination source, a mask, a projection objective lens system, and a silicon wafer coated with photoresist. As the critical dimension of integrated circuits enters into the technology node of 45 nm, and constantly moves towards a smaller dimension of 32 nm or even 22 nm, the pattern dimension to be exposed is much smaller than the wavelength of the light source in the litho cell. Thus, the Optical Proximity Effect (OPE) caused by the interference and diffraction of light waves in the photolithographic imaging system has become more and more significant. This causes the exposure pattern formed on the silicon wafer to be extremely deformed compared to the mask pattern used. Therefore, when practically designing a mask for the litho cell, it is necessary to adjust the mask pattern in advance considering this Optical Proximity Effect, so as to make the exposure pattern obtained on the silicon wafer more close to the desired target pattern.

In the existing optimization process of the mask, the mask usually needs to be gridded first, and the final optimization result is subject to the regularity of lattice points. When the same main pattern is located at different lattice points, the number of lattice points of the assistant feature obtained around the main pattern will be very different, as well as the location thereof relative to the main pattern, consequently the final optimized mask pattern is still not unsatisfied. As shown in FIG. 1A and FIG. 1B, the main pattern X1 and the main pattern X2 are similar, the lattice point generation areas of assistant features respectively correspond to M1 and M2. When the main pattern X1 and the main pattern X2 are located at different lattice points, for example, there is a big difference between the point O1 close to the vertex P1 of the main pattern X1 and the point O2 close to the vertex P2 of the main pattern X2. If the assistant features are placed at the point O1 and the point O2, it will have a different effect on the main patterns X1 and X2 respectively.

SUMMARY

To overcome the defect that the existing mask optimization technology is subject to the location of lattice points and leads to an unsatisfactory imaging of the optimized mask, the present invention provides a method, an apparatus and an electronic device for photolithographic mask optimization of joint optimization of pattern and image.

To solve the technical problem, an embodiment of the present invention provides a method for photolithographic mask optimization of joint optimization of pattern and image. The method includes the following steps: S1, inputting the main pattern; S2, dividing edges of each main pattern into short edges, and regarding the short edges as a first variable for optimizing the main pattern; S3, generating same or similar assistant feature sample points around same or similar main patterns, and regarding the assistant feature sample points as a second variable for optimizing the main pattern; S4, forming an objective function with the first variable and the second variable as optimization variables.

Preferably, in step S4, the objective function is defined as:

$$\text{Cost} = \text{Cost}(E, P) = \sum_i w_i \cdot [RI_i]^2$$

In the formula, E is the first variable, P is the second variable, wi is a weight of each monitoring point; the monitoring points are a plurality of points set on the main pattern for evaluating imaging errors, and RI is an image intensity on the photoresist.

Preferably, obtaining the RI includes the following steps: S41, gridding the mask to be optimized to obtain a gridded mask image MI; the mask to be optimized includes an initial mask to be optimized and masks after each iteration; S42, converting the gridded mask image MI into an exposure dose distribution map AI; and S43, calculating and obtaining the RI through the exposure dose distribution map AI.

Preferably, step S41 includes calculating with the first variable and the second variable as input values to obtain the gridded mask image MI.

Preferably, the MI is defined as:

$$MI(r) = MI(r,E,P) = MI_1(r,E) + MI_2(r,P)$$

In the formula, $MI_1(r,E)$ is obtained by a calculation from the main pattern to the gridded mask image MI, which is obtained by performing a convolution operation on the main pattern determined by the first variable E; $MI_2(r,P)$ is calculated by an interpolation which is defined as:

$$MI_2(r, P) = \sum_j P_j \cdot \text{Sinc}[r - r(P_j)]$$

In the formula, r is a location coordinate of each main pattern, Pj is a signal value of a j-th assistant feature sample point, and r(Pj) is a location of the j-th assistant feature sample point; information of the assistant feature sample points includes: the signal value Pj of the j-th assistant feature sample point, the location coordinate r of the main pattern, and the location r(Pj) of the j-th assistant feature sample point; j=1, 2, 3 . . . n, and n is an integer greater than zero.

Preferably, in step S3, an assistant feature placement area is formed around each main pattern, and the assistant feature sample points are generated in the assistant feature placement area according to a preset rule, which step S3 specifically includes the following steps: S31, setting a minimum variable x1 and a maximum variable x2 formed by an assistant feature placement area; S32, enlarging the main pattern by x1 to obtain a pattern A, and enlarging the main pattern by x2 to obtain a pattern B; S33, obtaining the assistant feature placement area by performing an exclusive OR operation on the pattern A and the pattern B; and S34, generating the assistant feature sample points in the assistant feature placement area.

Preferably, the assistant feature placement area is divided into a plurality of rectangular blocks, and the assistant feature sample points are generated in each rectangular block according to a preset spacing; a closest distance between edges of the pattern A and that of the main pattern is d1, and a closest distance between edges of the pattern B and that of the main pattern is d2; the value range of d1 is 20-100 nm, and the value range of d2 is 100-400 nm.

Preferably, the method for photolithographic mask optimization of joint optimization of pattern and image further includes a step S5, optimizing the objective function by an optimization algorithm, to obtain the assistant feature sample points where the assistant feature should be generated in the assistant feature placement area, and a moving displacement dimension of each short edge; the optimization process is based on an inversion lithography technology, and includes the following two stages: a first stage, optimizing the main pattern with the short edges thereof as the optimization variable, to obtain an initial optimized main pattern; and a second stage, optimizing the initial optimized main pattern with a combination of the short edges of the main pattern and the assistant feature sample points as the optimization variable, to further obtain the assistant feature sample points where the assistant feature should be generated in the assistant feature placement area, and the moving displacement dimension of each short edge.

To solve the above-mentioned technical problem, another embodiment of the present invention further provides an apparatus for photolithographic mask optimization of joint optimization of pattern and image. The apparatus includes an input module, configured to input a main pattern; a division module, configured to divide edges of the main pattern into short edges; an assistant feature placement area generation module, configured to generate an assistant feature placement area around the main pattern; an assistant feature sample point generation module, configured to generate assistant feature sample points in the assistant feature placement area; an objective function generation module, configured to form an objective function with a first variable and a second variable as optimization variables; and an optimization computation module, configured to optimize the objective function based on an inversion lithography technology, to obtain the assistant feature sample points where assistant features should be generated in the assistant feature placement area, and a moving displacement dimension of each short edge.

To solve the above-mentioned technical problem, another embodiment of the present invention further provides an electronic device. The electronic device includes one or more processors, and a storage device for storing one or more programs. When the one or more programs are executed by the one or more processors, the one or more processors implement any step of the method for photolithographic mask optimization of joint optimization of pattern and image described above.

Compared with the prior arts, generating same or similar assistant feature sample points around same or similar main patterns, so that assistant feature sample points will not be different due to specific locations of the main pattern, and are not limited to the regularity of lattice points. It can avoid that the assistant features generated according to the assistant feature sample points are greatly different, and avoid a large bias in the optimization results of the same main patterns, thereby improving the final optimization effects of the mask.

In the objective function, the information of the assistant feature sample points is regarded as the optimization variable, which can help better obtain the signal value of each assistant feature sample point during the process of optimizing the objective function based on an optimization algorithm. The assistant feature sample points where the assistant feature should be generated can be obtained by the signal value, which will obtain better optimization effects.

In the process of optimizing the objective function, the optimization process is divided into two stages. The first stage is to optimize the main pattern based on the short edges of the main pattern, that is, the first variable, which can preliminarily optimize the main pattern and reduce the influence of the Optical Proximity Effect. In the second stage, the first variable and the second variable are further combined to optimize the main pattern which is preliminarily optimized, so that the signal value of the assistant feature sample points for generating the assistant feature finally obtained is more accurate. Meanwhile, the displacement of the main pattern is more accurate.

The apparatus and electronic device for photolithographic mask optimization of joint optimization of pattern and image provided by the present invention have the same beneficial effects as the method for photolithographic mask optimization of joint optimization of pattern and image.

BRIEF DESCRIPTION OF THE DRAWINGS

FIG. 4 is a detailed flowchart of step S3 in the method of FIG. 1C according to the first embodiment of the present invention.

FIG. 5 is a schematic diagram of an assistant feature placement area in the method according to the first embodiment of the present invention.

FIG. 13 is a schematic diagram of modules of an apparatus for photolithographic mask optimization of joint optimization of pattern and image according to a second embodiment of the present invention.

FIG. 14 is a schematic diagram of modules of an electronic device according to a third embodiment of the present invention.

FIG. 15 is a schematic diagram of a computer system of a server applicable for implementing embodiments of the present invention.

DETAILED DESCRIPTION

In order to make the objectives, technical solutions, and advantages of the present invention clearer, the present invention is further described in detail below with reference to the accompanying drawings and embodiments. It should be understood that the specific embodiments described herein are provided for illustration only, and not for the purpose of limiting the invention.

Figure 1A:
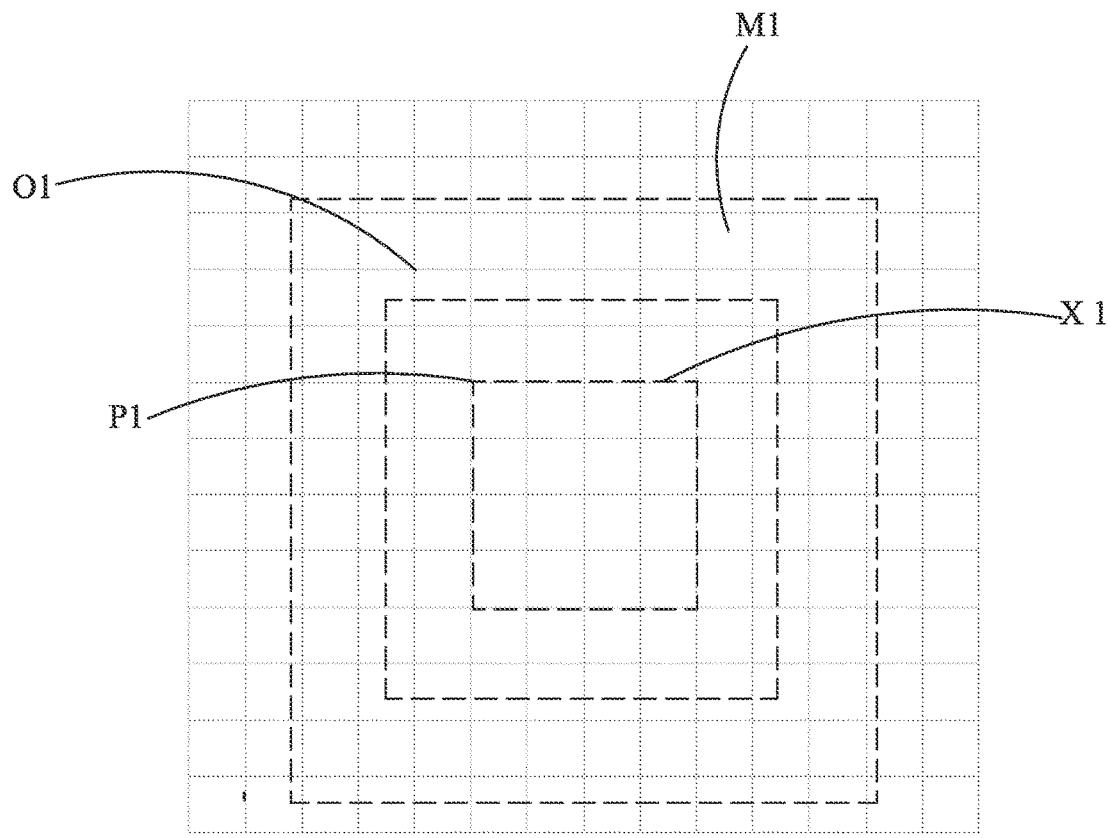
FIG. 1A is a schematic diagram of a main pattern according to the prior arts.
Figure 1B:
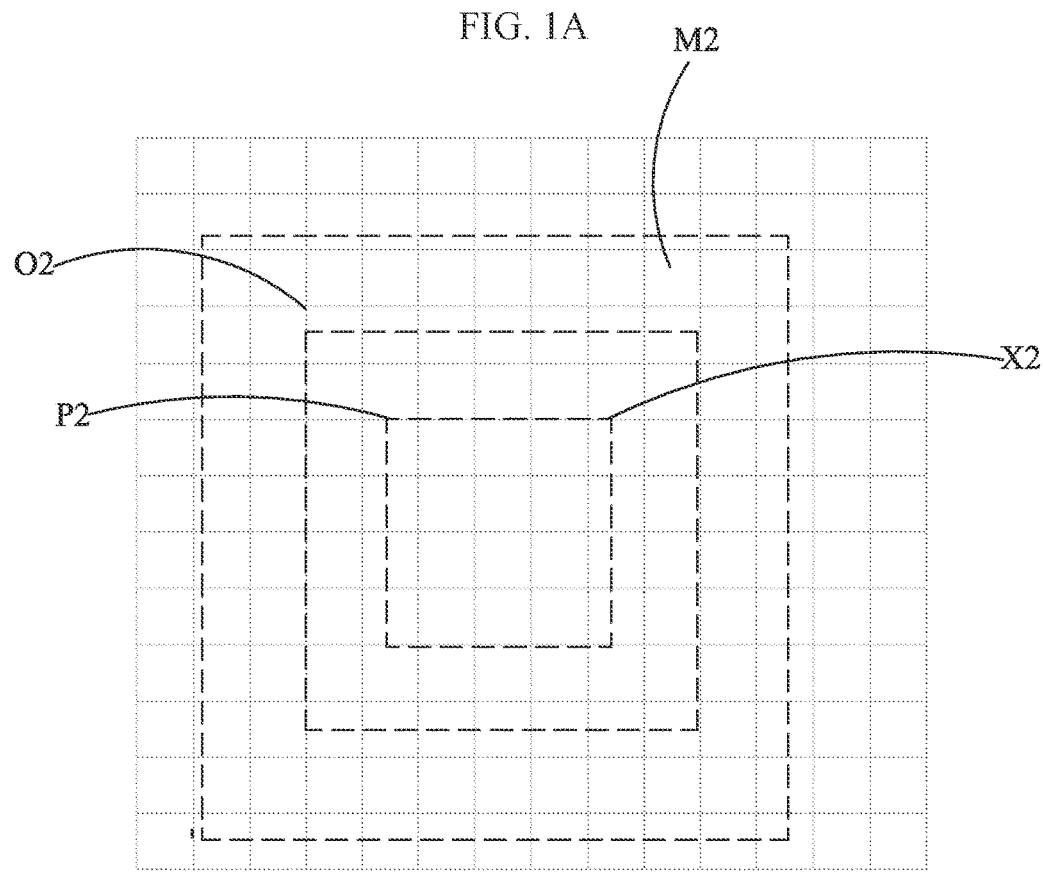
FIG. 1B is a schematic diagram of a main pattern located at different lattice points relative to that in FIG. 1A.
Figure 1C:
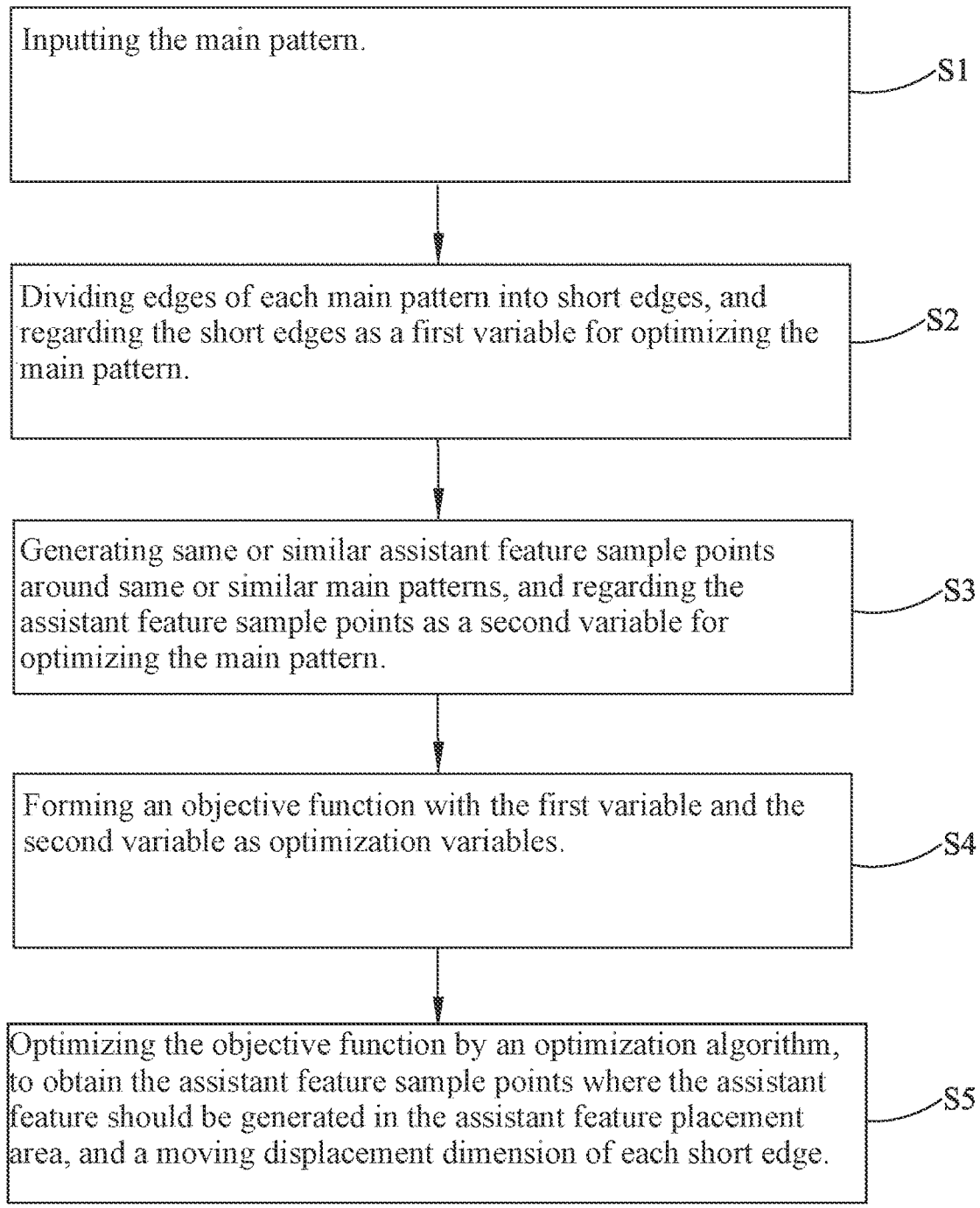
FIG. 1C is a flowchart of a method with steps S1-S5 for photolithographic mask optimization of joint optimization of pattern and image according to a first embodiment of the present invention.

Referring to FIG. 1C, a first embodiment of the present invention provides a method for photolithographic mask optimization of joint optimization of pattern and image, for optimizing an initial mask which includes at least one main pattern. The method includes the following steps:

S1, inputting a main pattern.

Figure 2:
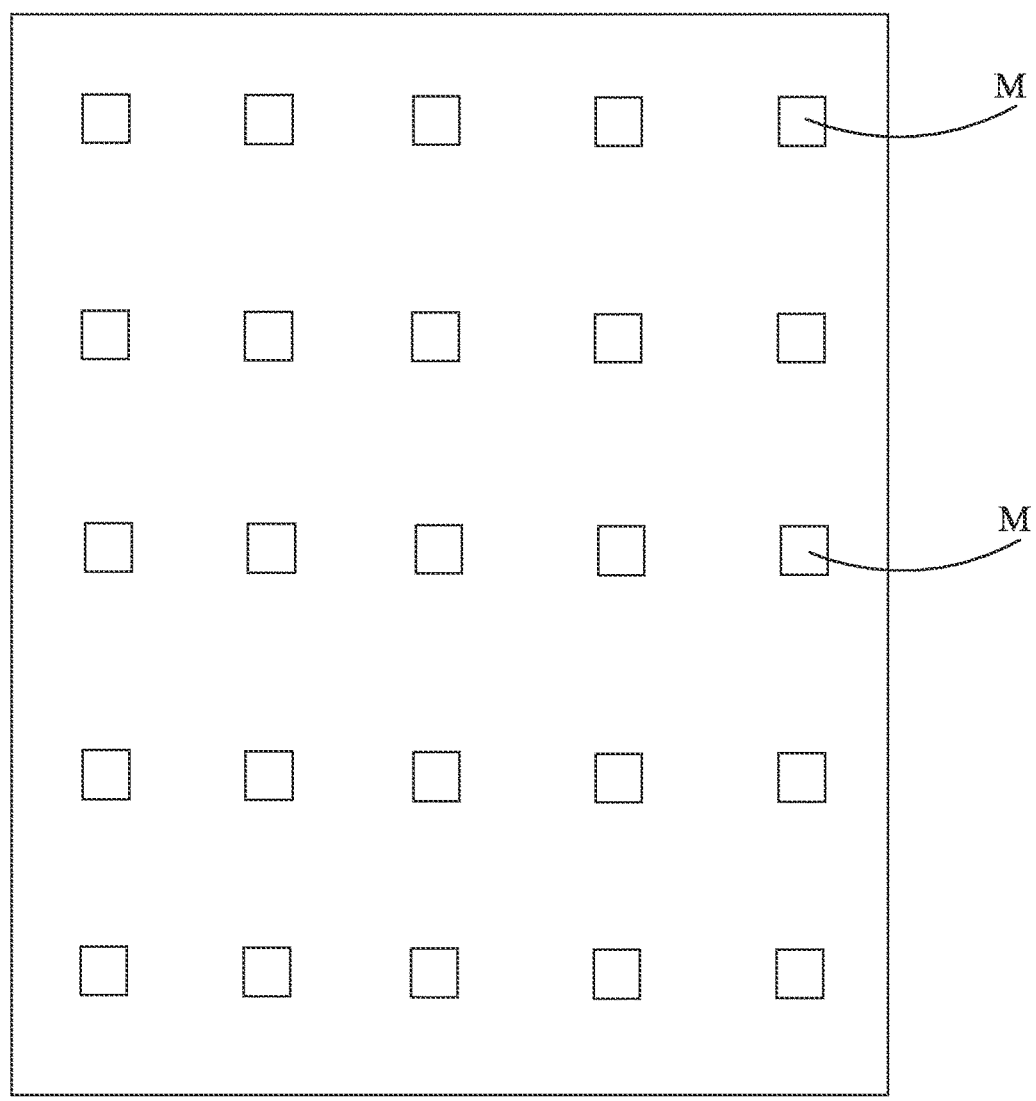
FIG. 2 is a schematic diagram of an initial mask to be optimized in the method according to the first embodiment of the present invention.

In this embodiment, a design pattern of a target chip is provided first, a mask corresponding to the design pattern of the target chip is designed accordingly, and the mask is laid out according to photolithographic requirements of the design pattern of the target chip. That is, the mask which is initially designed corresponds to an initial mask to be optimized having at least one main pattern. In this step, FIG. 2 shows the initial mask to be optimized and main patterns M. Generally, the main pattern is also called an exposure pattern, which will be transferred to an semiconductor device after exposure. In this embodiment, the main patterns M are configured as rectangles. In other embodiments, the main pattern can be configured as other patterns, mainly depending on specific shapes of the mask to be optimized, such as trapezoids, irregular polygons, regular polygons and other patterns. Preferably, the main pattern inputted exists in GDS format.

Referring to FIG. 1C again, the method for photolithographic mask optimization of joint optimization of pattern and image further includes the following steps:

S2, dividing edges of each main pattern into short edges, and regarding the short edges as a first variable for optimizing the main pattern.

Figure 3:
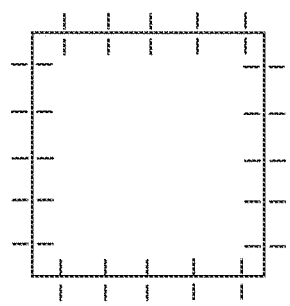
FIG. 3 is a schematic diagram of dividing edges of a main pattern in the method according to the first embodiment of the present invention.

Referring to FIG. 3, the edges of the main pattern are divided into short edges of small line segments, each short edge is marked as different types based on their locations. The short edge is a basic unit in the optimization process, wherein the short edges at different locations obtain different optimization variables. The division process makes the optimized object more clear, single and accurate, which can avoid the problem that the situation is too complicated when an overall optimization of the main pattern is performed. In this step, the optimization strategy of regarding the short edges as the first variable for optimization mainly corresponds to the movement of the line segments. Select different moving directions and moving steps according to different locations of different line segments and imaging features of the pattern on the photoresist, step by step, and iterate multiple times until a final optimization result is obtained.

Referring to FIG. 1C again, the method for photolithographic mask optimization of joint optimization of pattern and image further includes the following steps:

S3, generating same or similar assistant feature sample points around same or similar main patterns, and regarding the assistant feature sample points as a second variable for optimizing the main pattern.

In order to eliminate the influence of the Optical Proximity Effect which causes the main pattern on the initial mask to be optimized not identical to the desired photolithographic pattern. The main pattern needs to be processed by the Optical Proximity Correction (OPC). In addition, as the feature dimension enters into the range of 90 nm, the line width of the main pattern is even only ⅓ of the light wavelength. Besides the necessary Optical Proximity Correction mentioned above, it is also necessary to set a sub-size assistant feature around the main pattern, that is, Sub-Resolution Assistant Feature (SRAF). These sub-resolution assistant features are only set on the photolithographic mask and will not be transferred to the semiconductor device after actual exposure, but only serve to increase the depth of focus of proximate main patterns and improve the exposure accuracy. In this step, the same or similar main patterns can be understood as the main patterns with same or similar shapes and dimensions, such as squares, rectangles, trapezoids or other irregular patterns with same dimensions. For another example, one main pattern is configured as a square and the other main pattern is configured as an approximate square shape, then the two main patterns are considered similar.

Referring to FIG. 4, as an embodiment, step S3 specifically includes the following steps:

S31, setting a minimum variable x1 and a maximum variable x2 formed by an assistant feature placement area.

In this step, the assistant feature placement area is an area for placing the assistant features. The minimum variable x1 and the maximum variable x2 are enlargement coefficients of the main pattern, wherein the minimum variable x1 is less than or equal to the maximum variable x2, the minimum variable x1 is greater than or equal to zero, and the maximum variable x2 is not equal to zero.

Referring to FIG. 4 again, step S3 further includes the following steps:

S32, enlarging the main pattern by x1 to obtain a pattern A, and enlarging the main pattern by x2 to obtain a pattern B. The minimum variable x1 and the maximum variable x2 can be set as follows: the closest distance between edges of the pattern A and that of the main pattern is d1, and the closest distance between edges of the pattern B and that of the main pattern is d2, specifically, the value range of d1 is 20-100 nm, and the value range of d2 is 100-400 nm.

In this step, the pattern A and the pattern B are shown in FIG. 5.

Referring to FIG. 4 again, step S3 further includes the following steps:

S33, obtaining the assistant feature placement area by performing an exclusive OR operation on the pattern A and the pattern B.

In this step, as shown in FIG. 5, the assistant feature placement area is a filled area C enclosed and formed by edges of the pattern A and that of the pattern B. It can be seen that the profile of the assistant feature placement area is consistent with that of the main pattern.

Referring to FIG. 4 again, step S3 further includes the following steps:

S34, generating the assistant feature sample points in the assistant feature placement area.

In this step, the assistant feature sample points are regarded as the second variable for optimizing the main pattern. After the assistant feature sample points are generated, an initial signal value assigned to each assistant feature sample point is 0. In the optimization process, when the signal value of the assistant feature sample point exceeds a preset threshold, then the assistant feature is generated at a location corresponding to this assistant feature sample point, otherwise, it is not generated.

In this step, the assistant feature sample points are generated according to a predetermined rule. Specifically, the predetermined rule can be: setting multiple rows of assistant feature sample points, the spacing between any two adjacent assistant feature sample points in the same row is x, and the row spacing of any two adjacent rows is also x. In the specific optimization process, the value of x can be adjusted according to actual optimization effects.

In some other embodiments, in order to generate the assistant feature sample points more quickly and accurately, the assistant feature placement area can be divided into multiple rectangular blocks, and the assistant feature sample points are generated at a preset spacing x in each rectangular block.

Figures 6, 7:
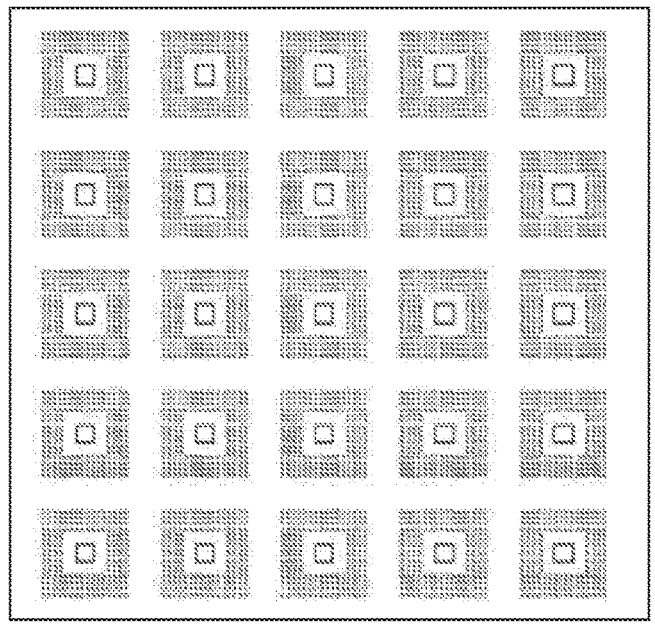
FIG. 6 is a schematic diagram of assistant feature sample points generated in the method according to the first embodiment of the present invention.
FIG. 7 is a detailed flowchart of step S4 in the method of FIG. 1C according to the first embodiment of the present invention.

Referring to FIG. 6, it shows the assistant feature sample points generated with d1=40 nm and d2=120 nm. The shapes and dimensions of each main pattern in FIG. 6 are the same, and their locations are different. It can be seen that the assistant feature sample points around each main pattern are arranged in a same manner, which is not affected by specific locations of the main patterns. That is, the same or similar assistant feature sample points are generated around each main pattern.

Referring to FIG. 1C again, the method for photolithographic mask optimization of joint optimization of pattern and image further includes the following steps:

S4, forming an objective function with the first variable and the second variable as optimization variables.

In step S4, as an embodiment, the objective function is defined as:

$$Cost = Cost(E, P) = \sum_i w_i \cdot [RI_i]^2$$

In the formula, E is the first variable, P is the second variable, $w_i$ is a weight of each monitoring point. The monitoring points are multiple points set on the main pattern for evaluating imaging errors. The imaging error is generally a gap calculated between an imaging pattern on the silicon wafer which is obtained by the mask iteratively optimized and a target pattern. Wherein, the main pattern includes the main pattern of the initial mask to be optimized and main patterns after each iteration. The $w_i$ is a value obtained based on human experience. The RI is an image intensity on the photoresist (Resist Image).

Referring to FIG. 7, obtaining the RI includes the following steps:

S41, gridding the mask to be optimized to obtain a gridded mask image MI; the mask to be optimized includes the initial mask to be optimized and masks after each iteration.

In this step, step S41 includes calculating with the first variable and the second variable as input values to obtain the gridded mask image MI. The MI can be defined by the following relational expression:

$$MI(r)=MI(r,E,P)=MI_1(r,E)+MI_2(r,P)$$

In the formula, r is a location coordinate of each main pattern, specifically, it can be expressed by a coordinate value of the top corner of the main pattern. $MI_1(r,E)$ is obtained by a calculation from the main pattern to the gridded mask image MI, that is, converting the main pattern into a two-dimensional image. Specifically, it can be obtained by performing a convolution operation on the main pattern determined by the first variable E, which specifically includes the following steps:

S411, obtaining a low-pass filter matrix (convolution kernel) by performing a convolution operation;

S412, calculating each pixel point of the main pattern, calculating a product of neighboring pixels of each pixel point and corresponding factors of the low-pass filter matrix, and adding values of the corresponding factors to obtain a feature value representing the pixel location, thereby forming a feature image of the main pattern.

It can be seen that the feature value on the feature image corresponds to $MI_1(r,E)$. It should be noted that, in this step, performing a convolution operation on the main pattern determined by the first variable E is a conventional image filter convolution operation algorithm, which will not be repeated here.

In some specific embodiments, $MI_2(r,P)$ is calculated by an interpolation, specifically, it can be expressed by the following formula:

$$MI_2(r, P) = \sum_j P_j \cdot Sinc[r - r(P_j)]$$

In the formula, r is the location coordinate of each main pattern, specifically, it can be expressed by a coordinate value of the top corner of the main pattern. Pj is a signal value of a j-th assistant feature sample point, and r(Pj) is a location of the j-th assistant feature sample point. It can be seen that information of the assistant feature sample points includes: the signal value Pj of the j-th assistant feature sample point, the location coordinate r of the main pattern, and the location r(Pj) of the j-th assistant feature sample point. j=1, 2, 3 . . . n, and n is an integer greater than zero. In subsequent optimization process, the Pj is optimized by an optimization algorithm, and the initial value of the Pj is 0. During the optimization process, when the value of the Pj exceeds a preset threshold, then the assistant feature can be generated at the assistant feature sample point corresponding to the Pj.

Referring to FIG. 7 again, obtaining the RI further includes the following steps:

S42, converting the gridded mask image MI into an exposure dose distribution map AI.

In this step, the exposure dose distribution map AI is mainly calculated according to a TCC theory of optical imaging. Specifically, the AI can be expressed by the following formula:

$$AI(r) = \sum_l \lambda_l \cdot |h_l(r) \otimes MI(r)|^2.$$

In the formula, $\lambda_l$ is a l-th intrinsic coefficient, $h_l$ is a l-th transmission matrix coefficient.

Specifically, calculating the AI mainly includes the following steps.

S421, calculating a cross transmission coefficient matrix;

S422, calculating a partial coherent kernel function; and

S423, obtaining the exposure dose distribution map AI based on the calculation of the partial coherence kernel function.

In step S421, the cross transmission coefficient matrix can be calculated by the existing analytical method, integral method, and Fourier transform method. Wherein the Fourier transform method can be applicable for different types of light sources and has a faster calculation rate. In this embodiment, the Fourier transform method is used for calculation.

In step S422, firstly, express the four-dimensional cross transmission coefficient matrix as a two-dimensional matrix, then perform an intrinsic value decomlocation on the two-dimensional matrix to obtain its intrinsic coefficient and intrinsic vector. Wherein, the intrinsic vector corresponds to the partial coherent kernel function. In this step, the intrinsic value decomlocation of the cross transmission coefficient matrix is mainly based on an optical imaging model Hopkins (Hopkins statistic), and previous 1 items are retained. Each item is expressed by intrinsic coefficients and intrinsic vectors (transmission matrix coefficients). Therefore, the l-th intrinsic coefficient $\lambda_l$ and the l-th transmission matrix coefficient $h_l$ are obtained.

The previous 1 items retained are values which have a great impact on the result. The last 1 items are substantially close to zero, and thus can be ignored.

In step S423, an aerial image calculated by a coherent imaging model for each kernel function which is obtained in step S422 is used to perform a weighted sum to the intrinsic coefficient, so as to obtain the exposure dose distribution map AI.

Referring to FIG. 7 again, obtaining RI further includes the following steps:

S43, calculating and obtaining the RI through the exposure dose distribution map AI.

In this step, the RI can be obtained from the exposure dose distribution map AI and some chemical effects of the resist.

In some specific embodiments, the RI can be obtained by, for example, the following function:

$$RI(r) = AI(r) \otimes \exp(-r^2/2\theta^2) - \text{threshold}$$

In the formula, $\theta$ is a constant representing a length scale of diffusion effects, and threshold is a truncation constant, that is, a preset threshold.

Referring to FIG. 1C again, the method for photolithographic mask optimization of joint optimization of pattern and image further includes the following steps:

S5, optimizing the objective function by an optimization algorithm, to obtain the assistant feature sample points where the assistant feature should be generated in the assistant feature placement area, and a moving displacement dimension of each short edge.

In this step, the optimization algorithm includes optimization methods such as Conjugate Gradient method, Quasi-Newton method, and L-BFGSB.

Specifically, in the optimization algorithm, it is necessary to calculate a first derivative of the first variable and the second variable with respect to the objective function.

The specific calculation process of the first derivative is as follows:

$$\frac{\partial Cost}{\partial E} = \frac{\partial Cost}{\partial RI} \cdot \frac{\partial RI}{\partial AI} \cdot \frac{\partial AI}{\partial MI} \cdot \frac{\partial MI}{\partial E} \qquad 1)$$
$$= \frac{\partial Cost}{\partial RI} \cdot \frac{\partial RI}{\partial AI} \cdot \frac{\partial AI}{\partial MI} \cdot \frac{\partial MI_1}{\partial E}$$

$$\frac{\partial Cost}{\partial P} = \frac{\partial Cost}{\partial RI} \cdot \frac{\partial RI}{\partial AI} \cdot \frac{\partial AI}{\partial MI} \cdot \frac{\partial MI}{\partial P} \qquad 2)$$
$$= \frac{\partial Cost}{\partial RI} \cdot \frac{\partial RI}{\partial AI} \cdot \frac{\partial AI}{\partial MI} \cdot \frac{\partial MI_2}{\partial P}$$

Wherein, in the formula 2), except for $$\frac{\partial MI_2}{\partial P_j} = \sum_r MI_2(r) \cdot Sinc[r - r(P_j)],$$

the calculation of the other formulas is consistent with the process of the existing ILT (Inverse Lithography Technology), which will not be repeated here.

Figure 8:
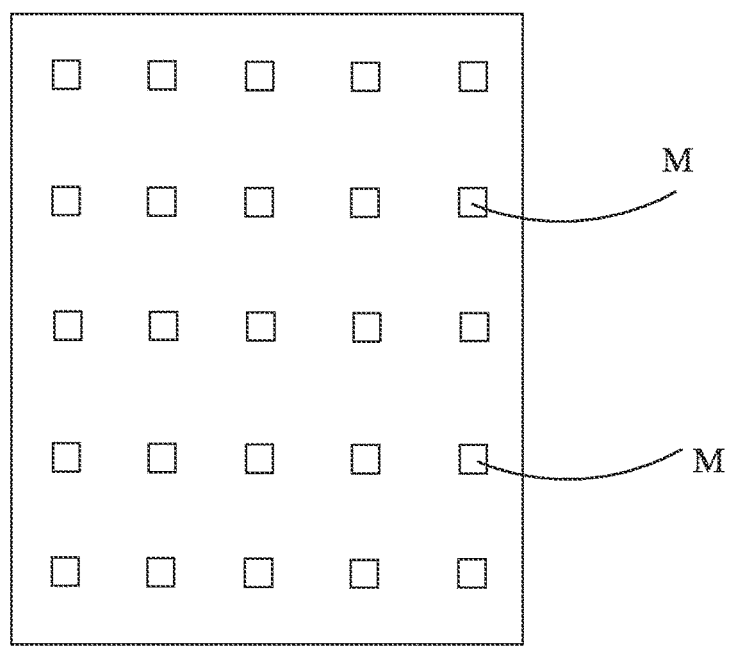
FIG. 8 is a schematic diagram of the initial mask to be optimized in the method according to the first embodiment of the present invention.
Figure 9:
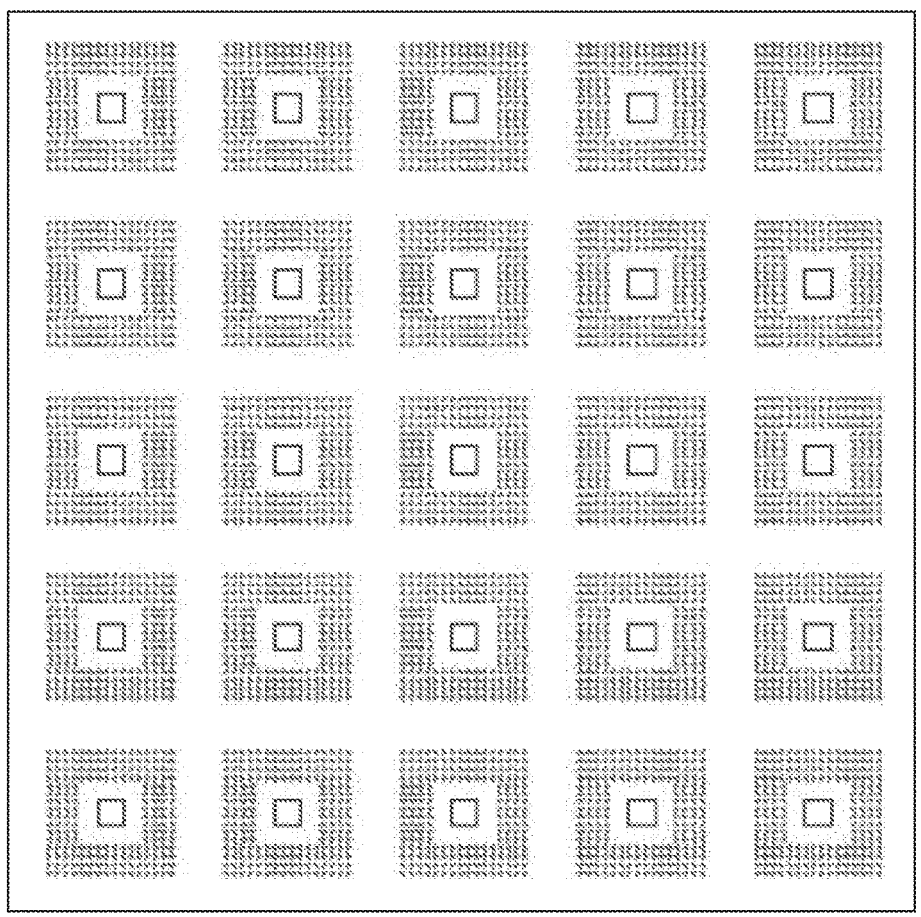
FIG. 9 is a schematic diagram of the assistant feature sample points generated in the method according to the first embodiment of the present invention.

Hereinafter, specific examples are given to illustrate the specific process of optimizing the main pattern. In this embodiment, the L-BFGSB algorithm is mainly used for illustration. Referring to FIG. 8, a group of squares M with a width of 62 nm and a pitch of 409 nm are input as the main patterns. Referring to FIG. 9, the main patterns M generate the assistant feature sample points in a range of [40 nm, 120 nm]. It can be clearly seen that the number and relative locations of the assistant feature sample points generated around the main patterns are consistent, regardless of the influence of specific grids.

Meanwhile, in this embodiment, multiple exposure conditions are used for measurement, specifically including standard exposure conditions (NC), exposure dose +3% (PD3), exposure dose −3% (ND3), defocus +40 nm (PF40), defocus −40 nm (NF40). The standard exposure condition means that the mask aligner is in an ideal working state, that is, the exposure value is at a preset standard value, and the lens focus is also at the preset standard value, without deviation.

The optimization process for the objective function is mainly divided into a first stage and a second stage.

Figure 10:
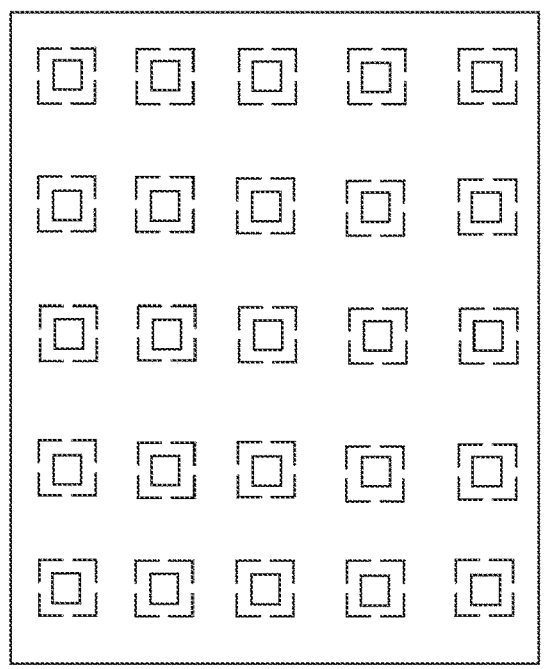
FIG. 10 is a schematic diagram of an optimized main pattern in the method according to the first embodiment of the present invention.

The first stage: optimizing the main pattern with the short edges thereof as the optimization variable. Firstly, calculate an exposure dose distribution map AI of the initial mask to be optimized, and calculate an objective function from a required pattern and the exposure dose distribution map AI, so as to adjust the location of the upper edge of the initial mask to be optimized and to obtain a next mask. The specific calculation process is as the above steps S41-S43, which will not be repeated here. Then continue to calculate the exposure dose distribution map AI, and calculate the objective function again to adjust the mask. Repeatedly, the preliminarily optimized design mask is finally obtained when the objective function reaches a smaller value. Optionally, the number of iterations in this stage is 15 times. As shown in FIG. 10, dotted frames are optimized main patterns.

Figure 11:
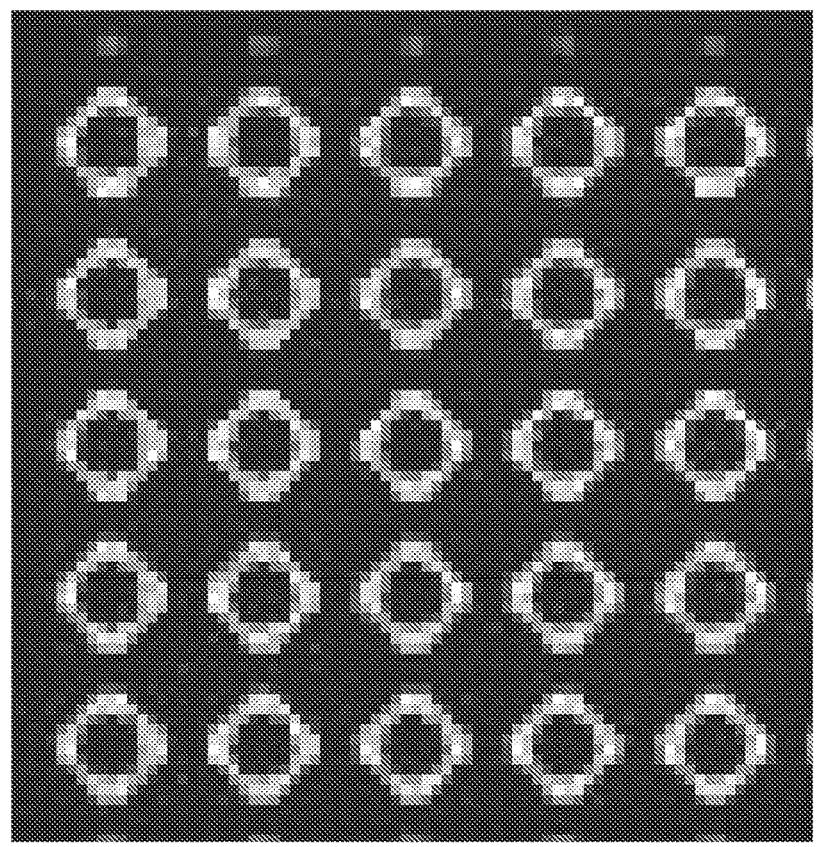
FIG. 11 is a schematic diagram of an optimized assistant image in the method according to the first embodiment of the present invention.

The second stage: a combination of the short edges of the main pattern and the assistant feature sample points is regarded as the optimization variable. In this stage, the edges of the main pattern are moving, and the signal value of the assistant feature sample point is combined as the result for feedback. That is, when the edges of the main pattern are moving, and when the signal value of the corresponding assistant feature sample point is also greater than the preset threshold, the assistant feature sample point where the assistant feature should be generated is obtained. In this stage, after 30 times of iterations, the assistant feature sample points where the assistant feature should be generated are obtained. As shown in FIG. 11, it shows an optimized assistant image.

It can be seen that the optimization in the second stage is based on the preliminary optimization of the main pattern in the first stage.

Figure 12:
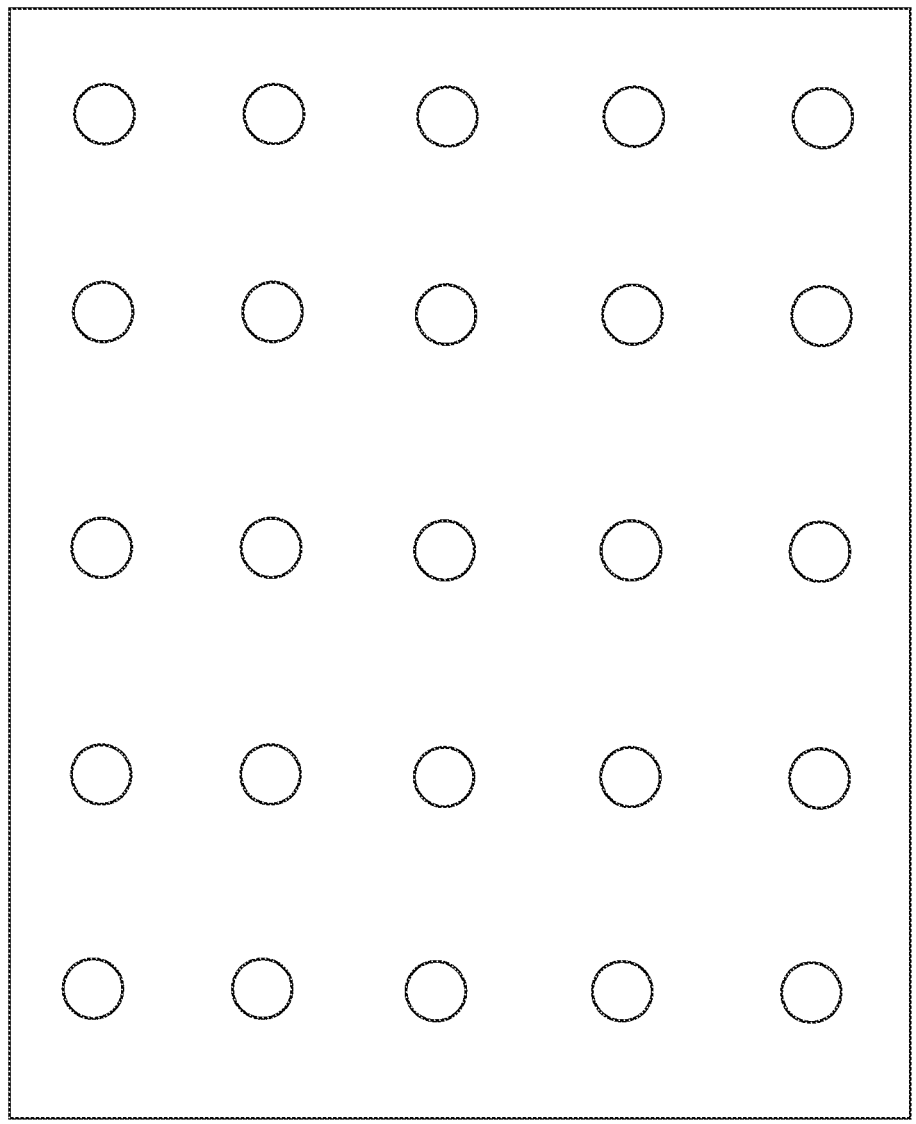
FIG. 12 is a schematic diagram of an optimized resist image in the method according to the first embodiment of the present invention.

The result of the joint optimization of pattern and image in this embodiment is calculated to obtain a resist image as shown in FIG. 12. And a statistical analysis on EPE (Edge Placement Error) and PV band (distribution width of EPE of a certain detection point under different exposure conditions) is performed to obtain the following values:

| Exposure Condition | Maximum EPE (nm) |
|---|---|
| NC | 0.50 |
| PD3 | 1.59 |
| ND3 | 1.15 |
| PF40 | 1.75 |
| NF40 | 0.77 |

Wherein, EPE refers to an error between edges of the pattern on the silicon wafer which is obtained by calculating the objective function and that of the actual required pattern (target pattern).

PV band refers to a distribution width of EPE under different exposure conditions.

Maximum PV band=2.97 nm.

It can be seen that the method for photolithography mask optimization of joint optimization of pattern and image provided by the present invention has a better optimization effect.

Referring to FIG. 13, a second embodiment of the present invention provides an apparatus 200 for photolithographic mask optimization of joint optimization of pattern and image. The apparatus 200 includes an input module 201, a division module 202, an assistant feature placement area generation module 203, an assistant feature sample point generation module 204, an objective function generation module 205, and an optimization computation module 206.

The input module 201 is configured to input a main pattern.

The division module 202 is configured to divide edges of the main pattern into short edges.

The assistant feature placement area generation module 203 is configured to generate an assistant feature placement area around the main pattern.

The assistant feature sample point generation module 204 is configured to generate assistant feature sample points in the assistant feature placement area.

The objective function generation module 205 is configured to form an objective function with a first variable and a second variable as optimization variables.

The optimization computation module 206 is configured to optimize the objective function based on an inversion lithography technology, to obtain the assistant feature sample points where assistant features should be generated in the assistant feature placement area, and a moving displacement dimension of each short edge.

Referring to FIG. 14, a third embodiment of the present invention provides an electronic device 300 which includes one or more processors 302, a storage device 301 for storing one or more programs. When one or more programs are executed by the one or more processors 302, the one or more processors 302 implement any step of the method for photolithographic mask optimization of joint optimization of pattern and image provided in the first embodiment.

Referring to FIG. 15, it shows a computer system 800 of a terminal device/server applicable for implementing embodiments of the present invention. The terminal device/server shown in FIG. 15 is only an example, and should not bring any limitation to the functions and the scope of the present application.

As shown in FIG. 15, the computer system 800 includes a central processing unit (CPU) 801, a read-only memory (ROM) 802 and a random access memory (RAM) 803. The central processing unit (CPU) 801 can perform various appropriate actions and processing according to a program which is stored in the read-only memory (ROM) 802 or loaded from a storage part 808 into the random access memory (RAM) 803. In the RAM 803, various programs and data for the operation of the computer system 800 are also stored. The CPU 801, the ROM 802, and the RAM 803 are connected through a bus 804. An input/output (I/O) interface 805 is also connected to the bus 804.

The following components are connected to the I/O interface 805: an input part 806 including a keyboard, a mouse, etc.; an output part 807 including a cathode ray tube (CRT), a liquid crystal display (LCD), a speaker, etc.; a storage part 808 including a hard disk, etc.; and a communication part 809 including a network interface card such as a LAN card, a modem, etc. The communication part 809 performs communication processing via a network such as the Internet. A driver 810 is also connected to the I/O interface 805 based on needs. A removable medium 811, such as a magnetic disk, an optical disk, a magneto-optical disk, a semiconductor memory, etc., is installed on the driver 810 based on needs, so that a computer program read from it is installed into the storage part 808 based on needs.

According to the embodiments of the present invention, the process described above may be implemented as a computer software program. For example, embodiments of the present invention include a computer program product that includes a computer program carried on a computer-readable medium. The computer program includes program codes for executing a method shown in a flow chart. In such an embodiment, the computer program may be downloaded and installed from the network through the communication part 809, and/or installed from the removable medium 811. When the computer program is executed by the central processing unit (CPU) 801, the above functions defined in the method of the present invention are executed. It should be noted that the computer-readable medium described in the present invention can be a computer-readable signal medium or a computer-readable storage medium or any combination of the two. The computer-readable storage medium can include, but is not limited to, systems, devices or components including, but not limited to, electrical, magnetic, optical, electromagnetic, infrared, or semiconductor, or any combination of the above. More detailed examples of the computer-readable storage medium may include, but are not limited to, an electrical connection with one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device or any suitable combination of the above.

The computer program codes for performing the operations of the present invention can be written in one or more programming languages or a combination thereof. The programming languages include object-oriented programming languages such as Java, Smalltalk, C++, and conventional procedural programming languages such as "C" or similar programming languages. The program codes can be completely executed on a user's computer, partially executed on the user's computer, executed as an independent software package, partially executed on the user's computer and partially executed on a remote computer, or completely executed on the remote computer or a server. In the case involving a remote computer, the remote computer may be connected to the user's computer through any kind of networks, including a local area network (LAN) or a wide area network (WAN), or may be connected to an external computer (e.g., through the Internet using an Internet service provider).

The flowcharts and block diagrams in the accompanying drawings illustrate possible system architectures, functions, and operations of the system, method, and computer program product according to various embodiments of the present invention. In this regard, each block in the flowcharts or block diagrams may refer to a module, a program segment, or a part of code. The module, program segment, or part of code contains one or more executable instructions for realizing specified logic functions. It should be noted that, in some alternative embodiments, the functions marked in the block may also occur in an order different from that marked in the drawings. For example, two blocks shown in succession can actually be executed substantially in parallel, and they can sometimes be executed in a reverse order, depending on the functions involved. It should also be noted that each block in the block diagrams and/or flowcharts, and a combination of blocks in the block diagrams and/or flowcharts, can be realized by a dedicated hardware-based system that performs the specified functions or operations. Or it can be realized by a combination of dedicated hardware and computer instructions.

The units involved in the embodiments described in the present invention can be implemented in software or hardware. The units can also be set in a processor, for example, it can be described as: a processor includes an input module, a division module, an assistant feature placement area generation module, an assistant feature sample point generation module, an objective function generation module, and an optimization computation module. Wherein, the names of these units do not constitute a limitation on the unit itself under certain circumstances. For example, the input module can also be described as "configured to input a main pattern". On the other hand, the present invention also provides a computer-readable medium. The computer-readable medium may be included in the device described in the above embodiment; or it may exist alone without being assembled into the device. The above-mentioned computer-readable medium carries one or more programs. When the one or more programs are executed by the device, the device divides edges of main patterns of an inputted mask to be optimized into short edges, and the short edges are regarded as a first variable for optimizing the main pattern. An assistant feature placement area is formed around the main pattern, and assistant feature sample points are generated in the assistant feature placement area according to a preset rule. The assistant feature sample points are regarded as a second variable for optimizing the main pattern. An objective function with the first variable and the second variable as optimization variables is formed; and the objective function is optimized by an optimization algorithm, to obtain the assistant feature sample points where the assistant feature should be generated in the assistant feature placement area, and a moving displacement dimension of each short edge.

The foregoing descriptions of the embodiments according to the present invention should not be construed as limiting the scope of the invention but as merely providing illustrations of some of the preferred embodiments thereof. Thus the scope of the invention should be determined by the appended claims and their legal equivalents. Furthermore, it will be apparent to those skilled in the art that various modifications, equivalents and improvements can be made herein within the scope of the invention.

The invention claimed is:

1. A method for photolithographic mask optimization of joint optimization of pattern and image, for optimizing an initial mask which comprises at least one main pattern comprising the following steps:
  S1, inputting the main pattern;
  S2, dividing edges of each main pattern into short edges, and regarding the short edges as a first variable for optimizing the main pattern;
  S3, generating same or similar assistant feature sample points around same or similar main patterns, and regarding the assistant feature sample points as a second variable for optimizing the main pattern;
  S4, forming an objective function with the first variable and the second variable as optimization variables wherein in step S4, the objective function is defined as:

$$\mathrm{Cost} = \mathrm{Cost}(E, P) = \sum_i w_i \cdot [RI_i]^2,$$

in the formula, E is the first variable, P is the second variable, wi is a weight of each monitoring point; the monitoring points are a plurality of points set on the main pattern for evaluating imaging errors, and RI is an image intensity on the photoresist;
  wherein obtaining the RI comprises the following steps:
  S41, gridding the mask to be optimized to obtain a gridded mask image MI; the mask to be optimized comprises an initial mask to be optimized and masks after each iteration;
  S42, converting the gridded mask image MI into an exposure dose distribution map AI; and
  S43, calculating and obtaining the RI through the exposure dose distribution map AI;
  wherein step S41 comprises calculating with the first variable and the second variable as input values to obtain the gridded mask image MI;
  wherein the MI is defined as:

$$MI(r)=MI(r,E,P)=MI_1(r,E)+MI_2(r,P),$$

in the formula, $MI_1(r,E)$ is obtained by a calculation from the main pattern to the gridded mask image MI, which is obtained by performing a convolution operation on the main pattern determined by the first variable E;
  $MI_2(r,P)$ is calculated by an interpolation which is defined as:

$$MI_2(r, P) = \sum_j P_j \cdot \mathrm{Sinc}[r - r(P_j)],$$

in the formula, r is a location coordinate of each main pattern, Pj is a signal value of a j-th assistant feature sample point, and r(Pj) is a location of the j-th assistant feature sample point; information of the assistant feature sample points comprises: the signal value Pj of the j-th assistant feature sample point, the location coordinate r of the main pattern, and the location r(Pj) of the j-th assistant feature sample point; j=1, 2, 3 . . . n, and n is an integer greater than zero.

2. The method for photolithographic mask optimization of joint optimization of pattern and image according to claim 1, wherein in step S3, an assistant feature placement area is formed around each main pattern, and the assistant feature sample points are generated in the assistant feature placement area according to a preset rule, which step S3 specifically comprises the following steps:
S31, setting a minimum variable x1 and a maximum variable x2 formed by an assistant feature placement area;
S32, enlarging the main pattern by x1 to obtain a pattern A, and enlarging the main pattern by x2 to obtain a pattern B;
S33, obtaining the assistant feature placement area by performing an exclusive OR operation on the pattern A and the pattern B; and
S34, generating the assistant feature sample points in the assistant feature placement area.

3. The method for photolithographic mask optimization of joint optimization of pattern and image according to claim 2, wherein the assistant feature placement area is divided into a plurality of rectangular blocks, and the assistant feature sample points are generated in each rectangular block according to a preset spacing; a closest distance between edges of the pattern A and that of the main pattern is d1, and a closest distance between edges of the pattern B and that of the main pattern is d2; the value range of d1 is 20-100 nm, and the value range of d2 is 100-400 nm.

4. The method for photolithographic mask optimization of joint optimization of pattern and image according to claim 1, wherein the method for photolithographic mask optimization of joint optimization of pattern and image further comprises a step S5, optimizing the objective function by an optimization algorithm, to obtain the assistant feature sample points where the assistant feature should be generated in the assistant feature placement area, and a moving displacement dimension of each short edge; the optimization process is based on an inversion lithography technology, and comprises the following two stages:
a first stage, optimizing the main pattern with the short edges thereof as the optimization variable, to obtain an initial optimized main pattern; and
a second stage, optimizing the initial optimized main pattern with a combination of the short edges of the main pattern and the assistant feature sample points as the optimization variable, to further obtain the assistant feature sample points where the assistant feature should be generated in the assistant feature placement area, and the moving displacement dimension of each short edge.

5. An apparatus for photolithographic mask optimization of joint optimization of pattern and image, comprising:
an input module, configured to input a main pattern;
a division module, configured to divide edges of the main pattern into short edges;
an assistant feature placement area generation module, configured to generate an assistant feature placement area around the main pattern;
an assistant feature sample point generation module, configured to generate assistant feature sample points in the assistant feature placement area;
an objective function generation module, configured to form an objective function with a first variable and a second variable as optimization variables; and
an optimization computation module, configured to optimize the objective function based on an inversion lithography technology, to obtain the assistant feature sample points where assistant features should be generated in the assistant feature placement area, and a moving displacement dimension of each short edge wherein in step S4, the objective function is defined as:

$$Cost = Cost(E, P) = \sum_i w_i \cdot [RI_i]^2,$$

in the formula, E is the first variable, P is the second variable, wi is a weight of each monitoring point; the monitoring points are a plurality of points set on the main pattern for evaluating imaging errors, and RI is an image intensity on the photoresist;
wherein obtaining the RI comprises the following steps:
S41, gridding the mask to be optimized to obtain a gridded mask image MI; the mask to be optimized comprises an initial mask to be optimized and masks after each iteration;
S42, converting the gridded mask image MI into an exposure dose distribution map AI; and
S43, calculating and obtaining the RI through the exposure dose distribution map AI;
wherein step S41 comprises calculating with the first variable and the second variable as input values to obtain the gridded mask image MI;
wherein the MI is defined as:

$$MI(r)=MI(r,E,P)=MI_1(r,E)+MI_2(r,P),$$

in the formula, $MI_1(r,E)$ is obtained by a calculation from the main pattern to the gridded mask image MI, which is obtained by performing a convolution operation on the main pattern determined by the first variable E;
$MI_2(r,P)$ is calculated by an interpolation which is defined as:

$$MI_2(r, P) = \sum_j P_j \cdot \text{Sinc}[r - r(P_j)],$$

in the formula, r is a location coordinate of each main pattern, Pj is a signal value of a j-th assistant feature sample point, and r(Pj) is a location of the j-th assistant feature sample point; information of the assistant feature sample points comprises: the signal value Pj of the j-th assistant feature sample point, the location coordinate r of the main pattern, and the location r(Pj) of the j-th assistant feature sample point; j=1, 2, 3 . . . n, and n is an integer greater than zero.

6. An electronic device, comprising one or more processors, and
a storage device for storing one or more programs;
when the one or more programs are executed by the one or more processors, the one or more processors implement any step of the method of claim 1.

* * * * *